United States Patent
Sakamoto et al.

(10) Patent No.: US 9,817,276 B2
(45) Date of Patent: Nov. 14, 2017

(54) LIQUID CRYSTAL DISPLAY DEVICE

(71) Applicant: SHARP KABUSHIKI KAISHA, Sakai, Osaka (JP)

(72) Inventors: Mayuko Sakamoto, Sakai (JP); Kazuhiko Tsuda, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/308,758

(22) PCT Filed: May 7, 2015

(86) PCT No.: PCT/JP2015/063188
§ 371 (c)(1),
(2) Date: Nov. 3, 2016

(87) PCT Pub. No.: WO2015/170700
PCT Pub. Date: Nov. 12, 2015

(65) Prior Publication Data
US 2017/0184888 A1    Jun. 29, 2017

(30) Foreign Application Priority Data

May 7, 2014   (JP) ................................ 2014-096388

(51) Int. Cl.
*G02F 1/1339*   (2006.01)
*G02F 1/1341*   (2006.01)
*G02F 1/1333*   (2006.01)

(52) U.S. Cl.
CPC .......... *G02F 1/1339* (2013.01); *G02F 1/1341* (2013.01); *G02F 1/133308* (2013.01); *G02F 2001/13398* (2013.01)

(58) Field of Classification Search
CPC .......... G02F 1/1339–1/13394; G02F 2001/13396–2001/13398
See application file for complete search history.

(56) References Cited

U.S. PATENT DOCUMENTS 9,651,837 B2 *   5/2017   Peng ................. G02F 1/136204
2003/0179335 A1   9/2003   Sato et al.
(Continued)

FOREIGN PATENT DOCUMENTS

JP   2003-222891   8/2003
JP   2009-186885   8/2009

OTHER PUBLICATIONS

International Search Report for PCT/JP2015/063188, dated Jul. 28, 2015, 2 pages.
(Continued)

*Primary Examiner* — Mariceli Santiago
(74) *Attorney, Agent, or Firm* — Steven Reiss

(57) ABSTRACT

A liquid crystal display device wherein a first substrate and a second substrate are bonded together by a sealing material, a pixel electrode, a common electrode, a shift register, a clock line, and a power supply line are formed on the first substrate, a plurality of conductive particles are mixed into the sealing material, the plurality of conductive particles are maintained at a same potential as the common electrode, and the plurality of conductive particles are disposed at a position overlapping at least a part of the power supply line, when viewed from a normal direction of the first substrate.

6 Claims, 7 Drawing Sheets

(56) References Cited

U.S. PATENT DOCUMENTS

| | | | |
|---|---|---|---|
| 2006/0215102 A1* | 9/2006 | Otose | G02F 1/13454 349/151 |
| 2010/0079694 A1* | 4/2010 | Yoshida | G02F 1/134363 349/40 |
| 2010/0118250 A1* | 5/2010 | Fujikawa | G02F 1/1345 349/139 |
| 2010/0171896 A1* | 7/2010 | Yoshida | G02F 1/1345 349/48 |
| 2012/0206680 A1* | 8/2012 | Onishi | G02F 1/134336 349/122 |
| 2015/0241746 A1* | 8/2015 | Hashiguchi | G02F 1/136204 349/139 |
| 2016/0147096 A1* | 5/2016 | Wu | H01L 51/5246 361/679.01 |

OTHER PUBLICATIONS

Written Opinion (JP language) for PCT/JP2015/063188, dated Jul. 28, 2015, 3 pages.

* cited by examiner

LIQUID CRYSTAL DISPLAY DEVICE

TECHNICAL FIELD

This application is the U.S. national phase of international Application No. PCT/JP2015/063188 filed May 7, 2015, which designated the U.S. and claims priority to patent application No. 2014-096388 filed in Japan on May 7, 2014, the entire contents of each of which are hereby incorporated by reference herein.

The present invention relates to liquid crystal display device.

The subject application claims priority based on the patent application No. 2014-096388 filed in Japan on May 7, 2014, and incorporates by reference herein the content thereof.

BACKGROUND ART

Lateral electric field type liquid crystal display devices such as represented by the IPS (in-plane switching) type and the FFS (fringe-field switching) type have been known as an aspect of a liquid crystal display device (refer to Patent Document 1). In recent years, development has progressed of GOA (gate-on-array) structured liquid crystal display devices, in which a shift register and a gate line group that inputs control signals to the shift register are monolithically formed on an array substrate (refer to Patent Document 2). The GOA structure is also called gate driverless, gate driver built into the panel, and gate-in-panel.

PRIOR ART DOCUMENTS

Patent Document

[Patent Document 1] Japanese Patent Application Publication No. 2009-186885
[Patent Document 2] Japanese Patent Application Publication No. 2003-222891

SUMMARY OF THE INVENTION

Problem to be Solved by the Invention

In a lateral electric field type liquid crystal display device, because electrodes are formed on the opposing substrate side, potential variations on the array substrate side cause potential variations on the opposing substrate side, and light leakage might occur at the periphery of the liquid crystal display device. In a liquid crystal display device with a GOA structure, a strong electric field is generated from the shift register and the peripheral gate line group (hereinafter these are called the GOA circuitry). Within the gate line group, a high voltage is applied to the power supply line, and the electric field generated from the power supply line is strong. Because the GOA circuitry is formed to be narrow and long along one side of the display region, the light leakage problem tends to become prominent.

Patent Document 1 describes a constitution in which, to suppress the influence of static electricity generated on the opposing substrate, a transparent conductive layer, a black matrix layer, a colored layer, and an overcoat layer are provided on one side of the opposing substrate, and the upper and lower conducting material that mixed into the sealing material makes contact with the transparent conductive layer of the opposing substrate.

A static electricity removal interconnect is provided on the array substrate and the static electricity removal interconnect is conductive with the transparent conductive layer of the opposing substrate via the sealing material. Therefore, static electricity generated on the opposing substrate is removed via the transparent conductive layer, the upper and lower conductive material, the static electricity removal interconnect, and also the flexible substrate connected to the array substrate.

With the structure of Patent Document 1, however, because the structure is such that the transparent conductive layer disposed on the liquid crystal layer side of the opposing substrate is connected to the outside via the flexible substrate, there is concern that an electrical charge from outside might reach the transparent conductive layer of the opposing substrate and influence the display of the liquid crystal display device.

An object of one aspect of the present invention is to provide a liquid crystal display device capable of suppressing light leakage at the display region periphery.

Means for Solving the Problems

In a liquid crystal display device according to one aspect of the present invention, a first substrate and a second substrate are bonded together by a sealing material, a pixel electrode, a common electrode, a shift register, a clock line, and a power supply line are formed on the first substrate, a plurality of conductive particles are mixed into the sealing material, the plurality of conductive particles are maintained at a same potential as the common electrode, and the plurality of conductive particles are disposed at a position overlapping at least a part of the power supply line, when viewed from a normal direction of the first substrate.

In the liquid crystal display device according to one aspect of the present invention, the plurality of conductive particles may be disposed at a position overlapping at least a part of the clock line, when viewed from the normal direction of the first substrate.

In the liquid crystal display device according to one aspect of the present invention, the plurality of conductive particles may be disposed at a position overlapping at least a part of the shift register, when viewed from the normal direction of the first substrate.

In the liquid crystal display device according to one aspect of the present invention, the conductive particles may be in mutual contact and also, by at least a part of the conductive particles contacting with a conductive layer electrically connected to the common electrode, the plurality of conductive particles may be maintained at a same potential as the common electrode.

In the liquid crystal display device according to one aspect of the present invention, the conductive layer may be disposed at a position overlapping at least a part of the shift register, when viewed from the normal direction of the first substrate.

In the liquid crystal display device according to one aspect of the present invention, a common line is formed on the first substrate, the common electrode is electrically connected to the common line, an insulating layer is formed on the common line, the pixel electrode and the conductive layer are formed on the insulating layer, and the conductive layer is electrically connected to the common line via a contact hole provided in the insulating layer.

Effect of the Invention

According to one aspect of the present invention, it is possible to provide a liquid crystal display device that is capable of suppressing light leakage at the periphery of the display region.

BRIEF DESCRIPTIONS OF THE DRAWINGS

Figure 7:
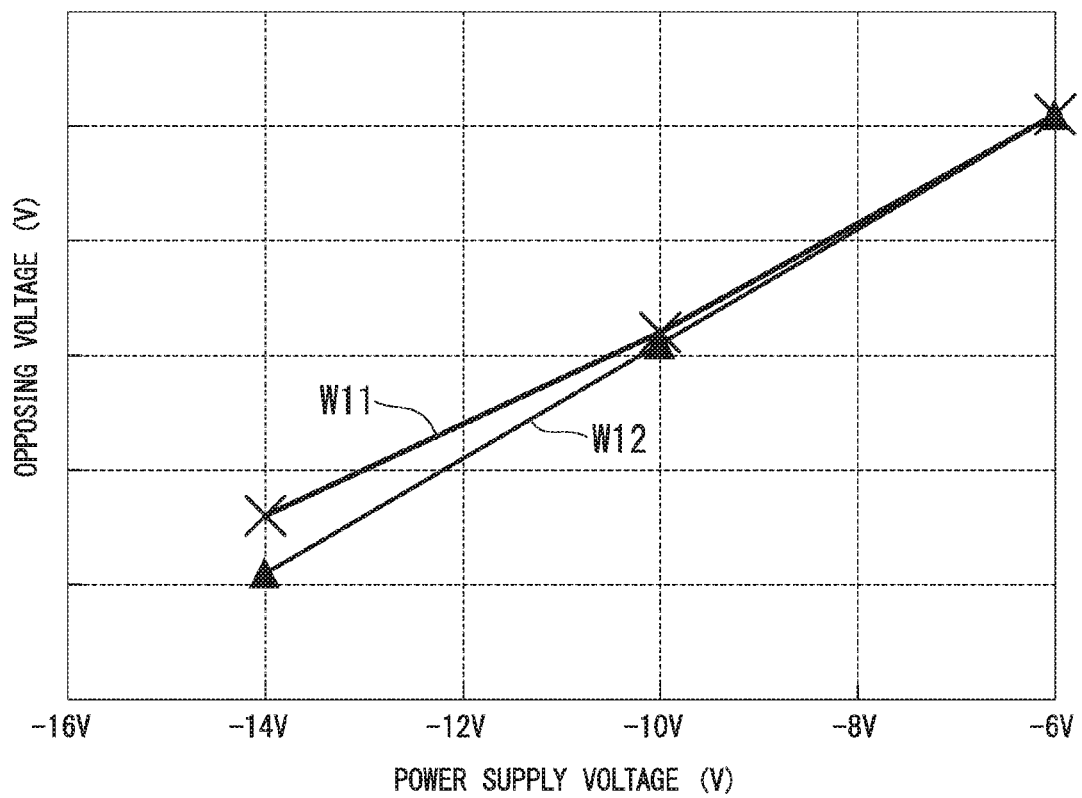

FIG. 7 describes the results of an experiment to emulate the liquid crystal display device according to the first embodiment.

Figure 8A:
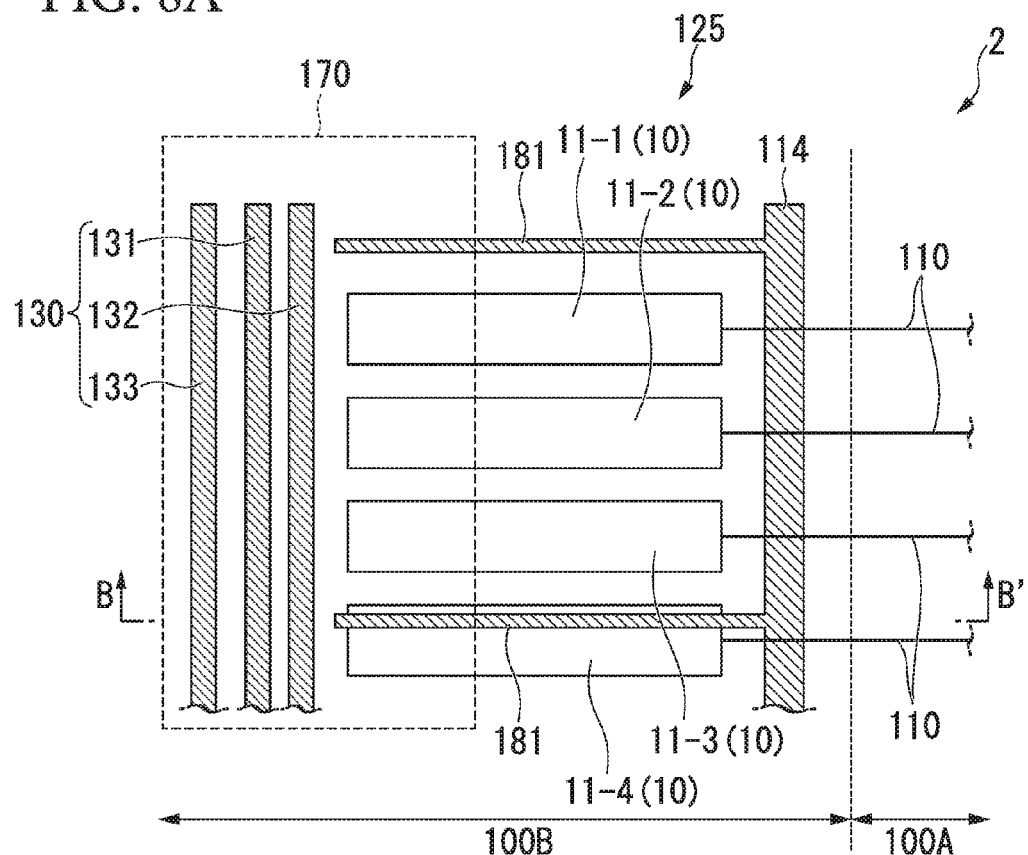

FIG. 8A is a first enlarged drawing showing the constitution in the vicinity of the shift register of a liquid crystal display device according to a second embodiment.

Figure 8B:
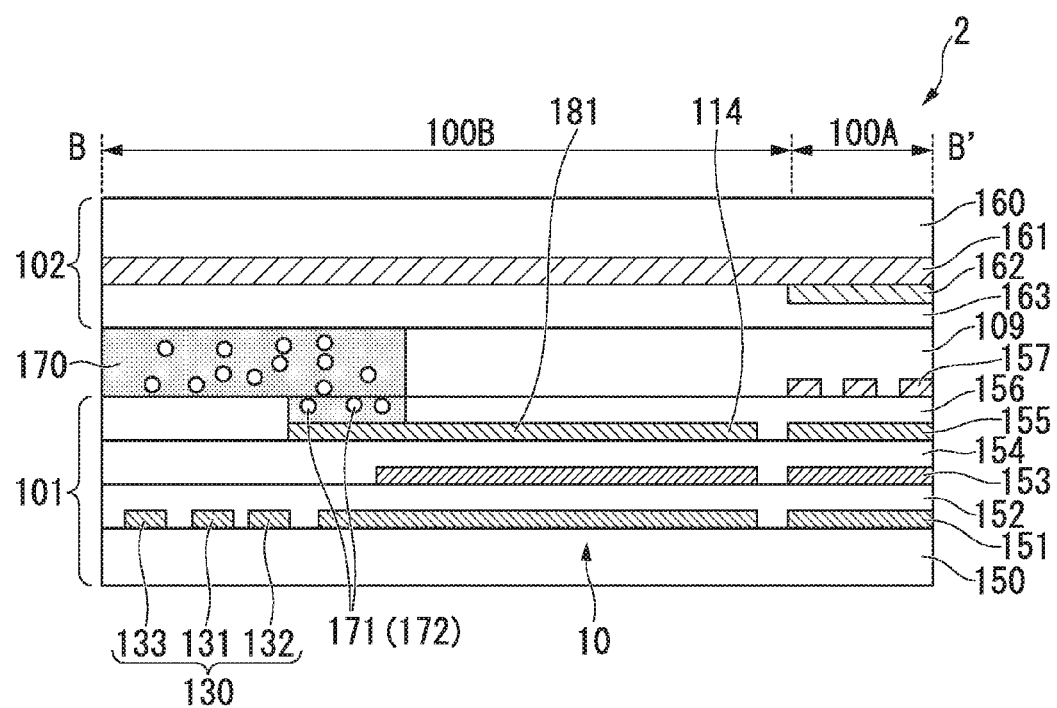

FIG. 8B is a second enlarged drawing showing the constitution in the vicinity of the shift register of a liquid crystal display device according to the second embodiment.

EMBODIMENTS FOR CARRYING OUT THE INVENTION

A liquid crystal display device according to an embodiment of the present invention will now be described, making reference to the drawings.

(First Embodiment)

Figure 1:
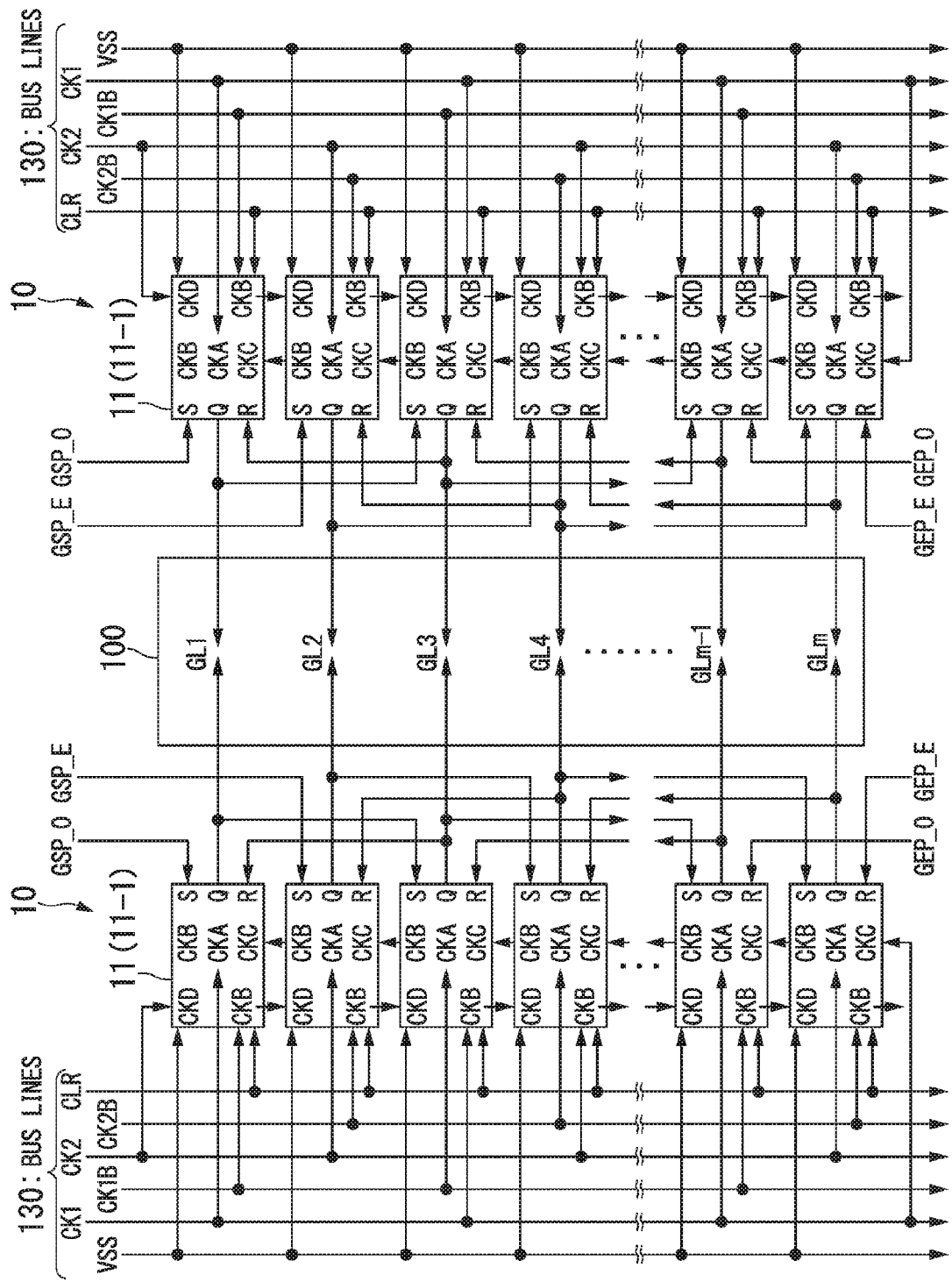
FIG. 1 is a simplified block diagram showing an example of the gate driver included in a liquid crystal display device according to a first embodiment.

A liquid crystal display device 1 according to the first embodiment, as shown in FIG. 1, has a display 100 (a pixel formation region of (m×n) pixels of a liquid crystal panel), shift registers 10, and bus lines 130 (power supply line and clock lines) that drive the shift register 10. At the time of forming pixels on the display 100, by integrating the shift registers 10 and the bus lines 130 in the liquid crystal display device 1, a monolithic gate driver is implemented.

FIG. 1 is a simplified block diagram of an example of a gate driver included in the liquid crystal display device 1 according to the first embodiment.

As shown in FIG. 1, the gate driver has shift registers 10 that include m bistable circuits 11 and bus lines 130 that include clock signal bus lines. In the following, m is an even number, n is an integer of 2 or larger, indicating the number of stages in the gate driver, and m=2a.

In FIG. 1, the shift register 10 is constituted by m bistable circuits 11 disposed in a line. Shift registers 10 are disposed on both sides of the display 100, and bus lines for the first to the fourth gate clock signals CK1, CK1B, CK2, and CK2B, a bus line for the low-potential DC power supply voltage VSS, and a bus line for the clear signal CLR are disposed so as to supply signal such as clock signals and other signals and a power supply voltage to each bistable circuit 11.

A bistable circuit 11 inputs four phases of clock signals CKA, CKB, CKC, and CKD (herein after the first to fourth clock), a set signal S, a reset signal R, a clear signal CLR, and the low-potential DC voltage VSS, and the bistable circuit 11 outputs the state signal Q. In addition, the bistable circuit 11 outputs the input second clock CKB to a nearby stage (including a neighboring stage) as a clock signal of the nearby stage (including a neighboring stage) of the shift register 10.

In the description below, the first-stage bistable circuit 11 is sometimes called the bistable circuit 11-1, and the m-th stage bistable circuit 11 is sometimes called the bistable circuit 11-*m*.

Each stage (bistable circuit 11) of a shift register 10 is supplied with the following signals. The low-potential DC voltage VSS and the cleat signal CLR are supplied in common to all stages. If k is an integer of 1 or greater, the (4k−3)th stage of bistable circuit 11 is supplied with the first gate clock signal CK1 as the first clock CKA, and the second gate clock signal CK1B as the second clock CKB. The (4k−2)th stage of bistable circuit 11 is supplied with the third gate clock signal CK2 as the first clock CKA and the fourth gate clock signal CK2B as the second clock CKB.

The (4k−1)th stage of bistable circuit 11 is supplied with the second gate clock signal CK1B as the first clock CKA and the first gate clock signal CK1 as the second clock CKB. The 4k-th bistable circuit 11 is supplied with the fourth gate clock signal CK2B as the first clock CKA and the third gate clock signal CK2 as the second clock CKB. Each stage of the shift register 10 receives the low-potential power supply voltage VSS, the clear signal CLR, the first clock CKA, and the second clock CKB from the bus lines 130.

The m-th stage (final stage) of bistable circuit 11 is supplied from the bus lines 130, as the third clock CKC, with the first gate clock signal CK1 (if a is an odd number) or the second gate clock signal CK1B (if a is an even number). FIG. 1 shows the case in which a is an odd number. The bistable circuits 11 other than the m-th stage are supplied with the second clock CKB output from the next stage, as the third clock CKC. The first-stage (initial stage) of bistable circuit 11 is supplied from the bus lines 130 with the third gate clock signal CK2 as the fourth clock CKD. The bistable circuits 11 other than the first stage are supplied with the second clock CKB output from the previous stage as the fourth clock CKD.

The first-stage bistable circuit 11 is supplied with the first gate start pulse signal GSP_O as the set signal S. The second-stage bistable circuit 11 is supplied with the second gate start pulse signal GSP_E as the set signal S. Bistable circuits 11 other than the first stage and second stage are supplied state signal Q output from two stages previously as the set signal S. The m-th stage bistable circuit 11 is supplied with the second gate end pulse signal GEP_E as the reset signal R. The (m−1)th stage bistable circuit 11 is supplied with the first gate end pulse signal GEP_O as the reset signal R. The bistable circuits 11 other than the (m−1)th stage and the m-th stage are supplied with the state signal Q output from two stages after as the reset signal R.

The display 100 includes m gate bus lines (scanning signal lines) GL1 to GLm, n source bus lines (video signal lines) SL1 to SLn (not shown), and (m×n) pixel formation parts (not shown) provided in correspondence to the intersections of these signal lines. The (m×n) pixel formation parts constitute a pixel array disposed in a matrix arrangement.

Next, the detailed construction of the bistable circuit 11 will be described, with reference made to FIG. 2.

Figure 2:
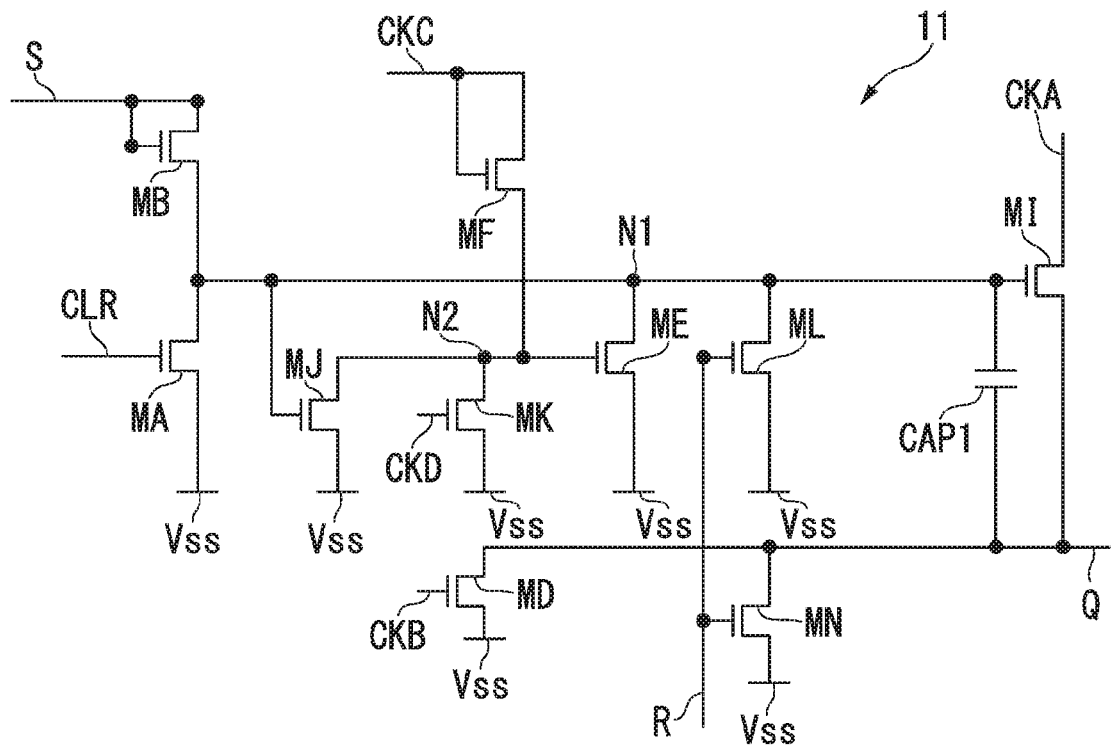
FIG. 2 is a circuit diagram showing an example of a bistable circuit included in the gate driver shown in FIG. 1.

FIG. 2 is a circuit diagram of an example of a bistable circuit 11 included in the gate driver in the present embodiment.

As shown in FIG. 2, the bistable circuit 11 has the ten thin-film transistors MA, MB, MI, MF, MJ, MK, ME, ML, MN, and MD and the capacitor CAP1. These thin-film transistors are, for example, n-channel type. The source terminal of the thin-film transistor MB, the drain terminals of the thin-film transistors MA, ME, and ML, the gate terminals of the thin-film transistors MJ and MI, and one end of the capacitor CAP1 are connected to the same node (hereinafter called the first node N1).

The drain terminals of the thin-film transistors MJ and MK, the source terminal of the thin-film transistor MF, and gate terminal of the thin-film transistor ME are connected to the same node (hereinafter called the second node N2).

The constituent elements included in the bistable circuit 11 have the following functions.

The thin-film transistor MA makes the potential on the first node N1 the low level when the clear signal CLR is at the high level. The thin-film transistor MB outputs the potential on the first node N1 as a high level when the set signal S is at the high level. The thin-film transistor MI supplies the potential of the first clock CKA to the output terminal Q when the potential on the first node N1 is at the high level. The output terminal Q of the bistable circuit 11 is connected to the corresponding gate bus line, and the first clock CKA is supplied from the power supply line. The thin-film transistor MI functions as a charge control switching transistor that charges the corresponding gate bus line, based on the clock signal received from the clock.

The thin-film transistor MF sets the potential on the second node N2 to the high level when the third clock CKC is at the high level. The thin-film transistor MF may be replaced by a capacitance between the third clock CKC and the second node N2.

The thin-film transistor MJ sets the potential on the second node N2 to the low level when the potential on the first node N1 is at the high level. In the period when the corresponding gate bus line is selected, when the potential on the second node N2 changes to the high level, the thin-film transistor ME goes into the on state, the potential on the first node N1 decreases, and the thin-film transistor MI goes into the off state. The thin-film transistor MJ is provided to prevent this phenomenon.

Thin-film transistor MK sets the potential on the second node N2 to the low level when the fourth clock CKD is at the high level. If the thin-film transistor MK is not provided, at times other than the period in which the corresponding gate bus line is selected, the potential on the second node N2 is always at the high level, and a bias voltage is continuously applied to the thin-film transistor ME. If that state continues, the threshold voltage of the thin-film transistor ME rises, and the thin-film transistor ME does not function sufficiently as a switch. The thin-film transistor MK is provided to prevent this phenomenon.

The thin-film transistor ME sets the potential on the first node N1 to the low level when the potential on the second node N2 is at the high level. The thin-film transistor ML sets the potential on the first node N1 to the low level when the reset signal R is at the high level. The thin-film transistor MN sets the potential on the output terminal Q to the low level when the reset signal R is at the high level. The thin-film transistor MD sets the potential on the output terminal Q to the low level when the second clock CKB is at the high level. The capacitor CAP1 functions as a compensation capacitance that maintains the potential on the first node N1 at the high level during the period in which the corresponding gate bus line is selected.

Next, referring to FIG. 3, the gate clock signals input to the shift register 10 will be described.

Figure 3:
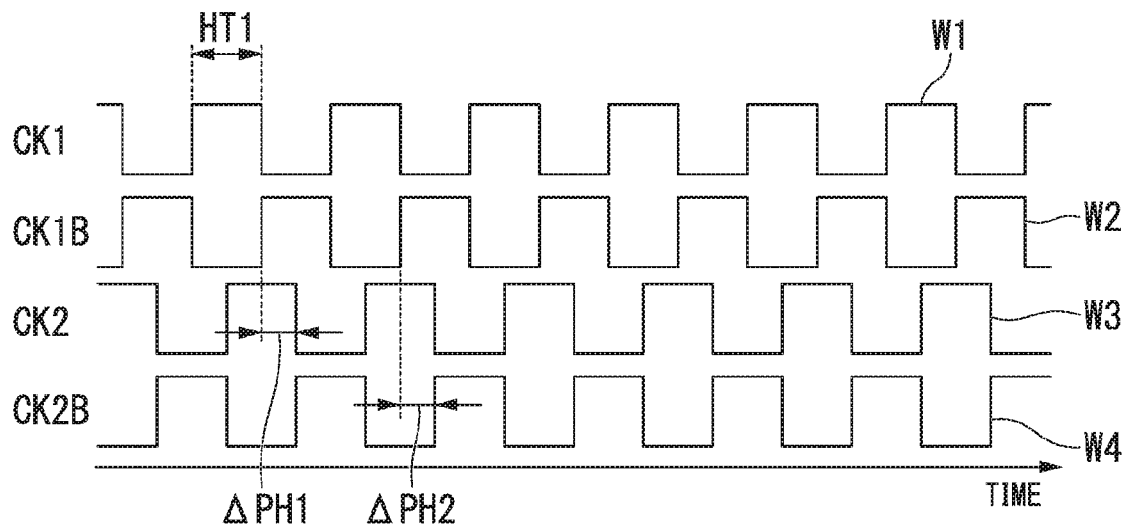
FIG. 3 is a timing diagram of the gate clock signals input to the gate driver shown in FIG. 1.

FIG. 3 is a timing diagram of the gate clock signals input to the gate driver in the present embodiment.

In the drawing, the waveform W1 shows the potential waveform on the first gate clock signal CK1, and the waveform W2 shows the potential waveform on the second gate clock signal CK1B. The waveform W3 shows the potential waveform on the third gate clock signal CK2, and the waveform W4 shows the potential waveform on the fourth gate clock signal CK2B. In each of these waveforms, the vertical axis represents potential, and the horizontal axis represents time.

As shown in FIG. 3, the potentials of the first to fourth gate clock signals CK1, CK1B, CK2, and CK2B each change to the high level for every other horizontal scanning period HT1. The phases of the first gate clock signal CK1 and second gate clock signal CK1B are mutually offset by 180 degrees (a period corresponding to one horizontal scanning period HT1), and the phases of the third gate clock signal CK2 and the fourth gate clock signal CK2B are also mutually offset by 180 degrees.

The phase of the first gate clock signal CK1 leads the phase of the third gate clock signal CK2 by 90 degrees. That is, the phase difference ΔPH1 between the first gate clock signal CK1 and the third gate clock signal CK2 is 90 degrees.

In the same manner, the phase of the second gate clock signal CK1B leads the phase of the fourth gate clock signal CK2B by 90 degrees. That is, the phase difference ΔPH2 between the second gate clock signal CK1B and the fourth gate clock signal CK2B is 90 degrees.

Next, referring to FIG. 4, the operation of the bistable circuit 11 will be described.

Figure 4:
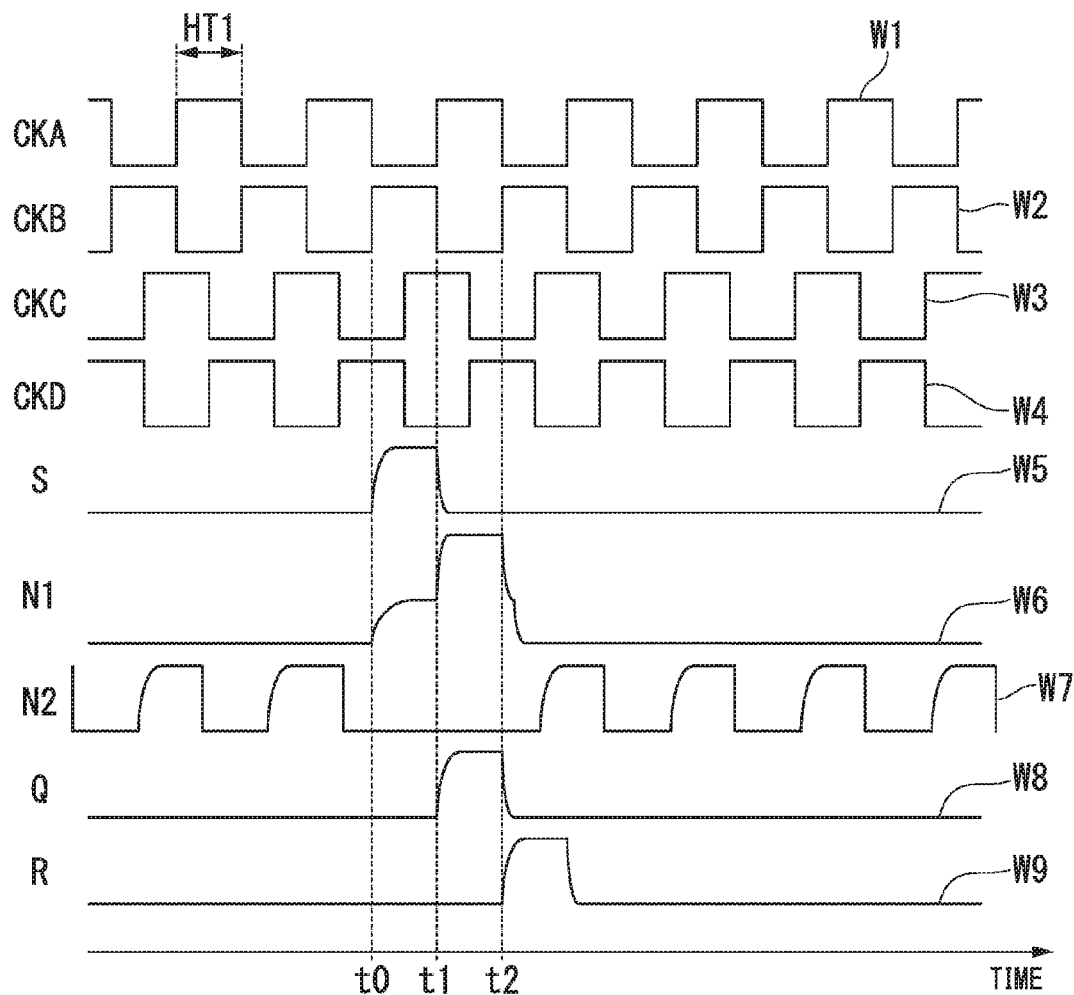
FIG. 4 is a timing diagram showing the variations in potential of the bistable circuit included in the gate driver shown in FIG. 1.

FIG. 4 is a timing diagram showing the change in the potentials in the bistable circuits 11 included in the gate driver in the present embodiment.

In this drawing, the waveforms W1 to W4, similar to FIG. 3, show the potential waveforms of the first to the fourth gate clock signals CK1, CK1B, CK2, and CK2B. The waveform W5 shows the potential waveform of the set signal S, the waveform W6 shows the potential waveform at the first node N1, and the waveform W7 shows the potential waveform at the second node N2. The waveform W8 shows the potential waveform of the state signal Q, and the waveform W9 shows the potential waveform of the reset signal R. In each of these waveforms, the vertical axis represents potential, and the horizontal axis represents time.

During operation of the liquid crystal display device 1, the first to fourth clocks CKA, CKB, CKC, and CKD applied to the bistable circuits 11 change as shown by the waveforms W1 to W4 in FIG. 4.

At time t0, when the set signal S changes to high level, the thin-film transistor MB pre-charges the first node N1 to the high level. That is, because the thin-film transistor MB is diode-connected, if the set signal S is at the high level, the thin-film transistor MB pre-charges the first node N1 to the high level (refer to waveform W6). In this case, because the thin-film transistor MJ goes into the on state (conducting state), the potential at the second node N2 changes to the low level (refer to waveform W7). At that point in time, the reset signal R is at the low level. Therefore, the thin-film transistors ME and ML are in the off state (non-conducting state). Thus, the potential at the pre-charged first node N1 is maintained at the high level until time t2, which is described later.

Next, at time t1, when the first clock CKA changes from low level to high level, the source terminal of the thin-film transistor MI is supplied with the first clock CKA. A parasitic capacitance (not shown) exists between the gate and the source of the thin-film transistor MI. For that reason, when the source potential of the thin-film transistor MI rises, the gate potential of the thin-film transistor MI also rises (that is, the first node N1 is bootstrapped). As a result, the thin-film transistor MI goes into the state (on state) in which a sufficiently high voltage is applied to the gate terminal.

From time t1 until time t2, because the first clock CKA is at the high level, the state signal Q is at the high level for that same period of time (refer to waveform W8). As a result, the gate bus line connected to the output terminal Q goes into the selected state, and in a plurality of pixel formation regions connected to the gate bus line, a video signal is written into the pixel capacitances.

At time t2, the first clock CKA changes from high level to low level, and the second clock CKB and the reset signal R change from the low level to the high level (refer to waveform W2 and waveform W9). This places the thin-film transistors MD, ML, and MN into the on state. When the thin-film transistors MD and MN go into the on state, the state signal Q changes to the low level (refer to waveform W8). When the thin-film transistor ML goes into the on state, the potential at the first node N1 changes to the low level (refer to waveform W6). As a result, during the period from when the set signal S changes to high level and when the reset signal R changes to high level, if the first clock CKA is at the high level, the bistable circuit 11 outputs a high level to the state signal Q.

In this case, as shown in FIG. 1, m bistable circuits 11 are connected, and the first to fourth gate clocks signals CK1, CK1B, CK2, and CK2B are caused to change as shown in FIG. 3. Additionally, the first gate start pulse signal GSP_O, the second gate start pulse signal GSP_E, the first gate end pulse signal GEP_O, and the second gate end pulse signal GEP_E are controlled to the high level only during the one horizontal scanning period HT1 with a prescribed timing.

By doing this, an odd-numbered stage bistable circuit 11 sequentially transfers pulses included in the first gate start pulse signal GSP_O from the first stage to the (m−1)th stage. In the same manner, an even-numbered stage bistable circuit 11 sequentially transfers pulse included in the second gate start pulse signal GPS_E from the second stage to the m-th stage. Therefore, the state signals Q output from each stage of the shift register 10 sequentially change to the high level. With the scanning signals as Gout(1) to Gout(m) the state signals Q are supplied, respectively, to the gate pulse lines GL1 to GLm. Doing this, the shift register 10 outputs the scanning signals Gout(1) to Gout (m), which sequentially change to high level each one horizontal scan period HT1, to the gate bus lines GL1 to GLm provided in the display 100.

Next, referring to FIG. 5A and FIG. 5B, the layout of the liquid crystal display device 1 according to the present embodiment will be described.

Figure 5A:
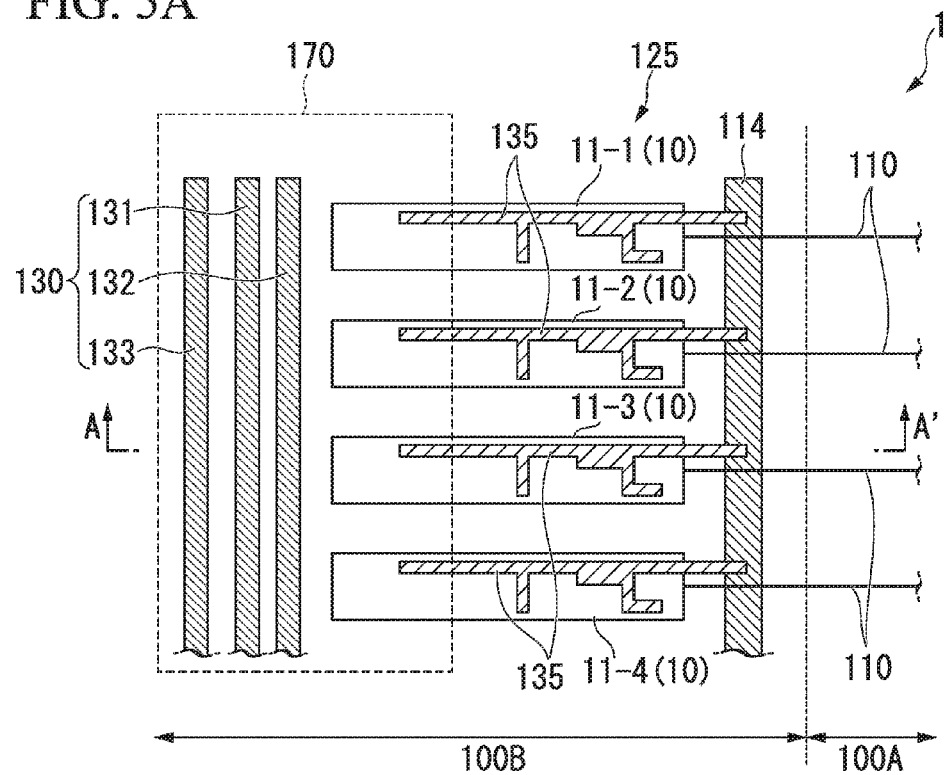
FIG. 5A is a first enlarged drawing showing the constitution in the vicinity of the shift register of the liquid crystal display device according to the first embodiment.
Figure 5B:
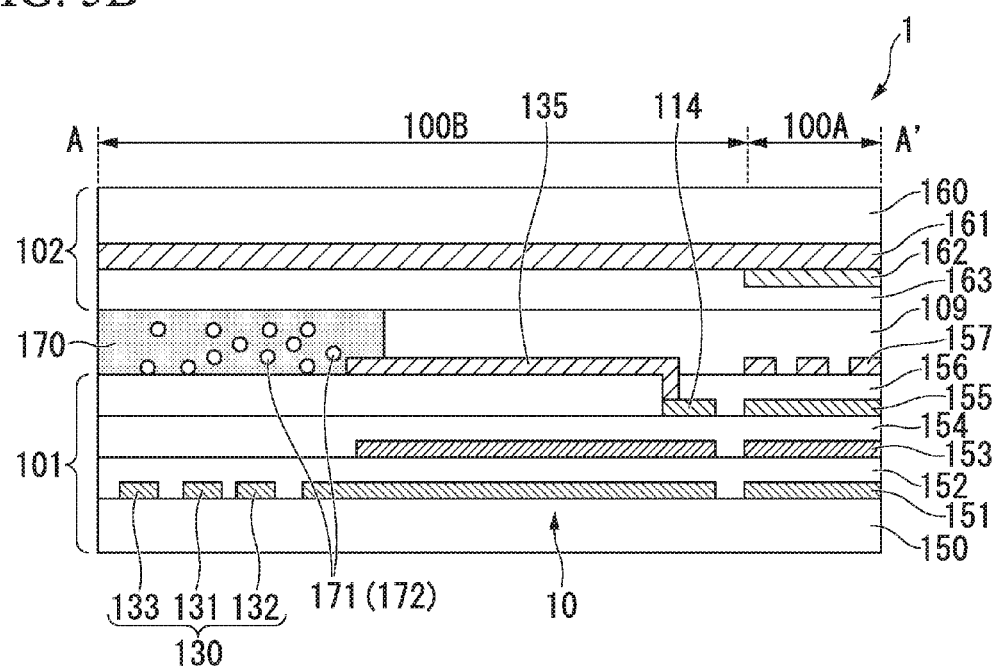
FIG. 5B is a second enlarged drawing showing the constitution in the vicinity of the shift register of the liquid crystal display device according to the first embodiment.

FIG. 5A is a partial plan view of the liquid crystal display device 1, showing in enlarged form the constitution in the vicinity of a shift register 10. FIG. 5B is a cross-sectional view of the liquid crystal display device 1 along the line A-A' in FIG. 5A. In FIG. 5A and FIG. 5B, the reference symbol 100A indicates the display region in which a plurality of pixels are disposed in a matrix arrangement, and the reference symbol 100B indicates a part, of the opposing region in which the first substrate 101 and the second substrate 102 are opposing, positioned outside the display region 100A (the so-called frame region).

The liquid crystal display device 1 has a first substrate 101, a second substrate 102, and a liquid crystal layer 109. The first substrate 101 and the second substrate 102 are disposed so as to be mutually opposing. The liquid crystal layer 109 is sandwiched between the first substrate 101 and the second substrate 102. A sealing material 170 is provided in the frame region of the opposing region in which the first substrate 101 and the second substrate 102 are opposing. The first substrate 101 and the second substrate 102 are bonded together by the sealing material 170. A liquid crystal is injected in the space surrounded by the first substrate 101, the second substrate 102, and the sealing material 170, thereby forming the liquid crystal layer 109.

The first substrate 101 has a transparent main substrate 150 such as glass, quartz, or plastic as a base. A first wiring layer 151 is formed on the inside surface (liquid crystal layer 109 side) of the main substrate 150. A first insulating layer 152 is formed to cover the first wiring layer 151 by a transparent insulating material such as silicon oxide.

The first wiring layer 151 includes, for example, the gates and gate lines 110 of thin-film transistors included in the display region 100A and the shift register 10. The first wiring layer 151 includes, for example, the second clock line 132, the first clock line 131, and the power supply line 133 that constitute the gate line group. The second clock line 132, the first clock line 131, and the power supply line 133 are disposed on the opposite side from the display region 100A, with the shift register 10 therebetween. In the case of the present embodiment, although the second clock line 132, the first clock line 131, and the power supply line 133 are disposed in this sequence from the side closest to the shift register 10, there is no restriction to this sequence of lines.

A second wiring layer 153 is formed on the first insulating layer 152. A second insulating layer 154 made of a transparent insulating material such as silicon oxide is formed to cover the second wiring layer 153. A common electrode 155 and a common line 114 made of a transparent conductive material such as ITO are formed on the second insulating layer 154. A third insulating layer 156 made of a transparent insulating material such as silicon oxide is formed to cover the common electrode 155 and the common line 114. A pixel electrode 157 and a conductive layer 135 made of a transparent conductive material such as ITO are formed on the third insulating layer 156.

The second wiring layer 153 includes, for example, the source and drain of the thin-film transistors included in the display region 100A and the shift register 10, and data lines. The common electrode 155 and the common line 114 are formed from the same material, and are electrically connected. The common electrode 155 is formed over the entire surface of the display region 100A and serves as the common electrode for all pixels. The common electrode 155 and the common line 114 are formed simultaneously, by forming a transparent conductive material such as ITO over the entire surface of the substrate and then patterning it.

The pixel electrode 157 and the conductive layer 135 are formed from the same material. The pixel electrode 157 and the conductive layer 135 are formed simultaneously, by forming a transparent conductive material such as ITO over the entire surface of the substrate and then patterning it. The conductive layer 135 is electrically connected to the common line 114 via a contact hole provided in the third insulating layer 156. The conductive layer 135 is maintained at the same potential as the common electrode 155.

The conductive layer 135 is disposed at a position at which it overlaps with at least a part of the shift register 10 when viewed from the normal direction of the first substrate 101. As a result, the conductive layer 135 functions as a shield electrode that shields an electric field generated from the shift register 10. One end part of the conductive layer 135 is connected to the common line 114, and the other end thereof extends up to the region in which the sealing material 170 is formed. The sealing material 170 is disposed in a position at which it overlaps with the power supply line 133, the second clock line 132, the first clock line 131, and the shift register 10, when viewed from the normal direction of the first substrate 101.

The power supply line 133, the second clock line 132, and the first clock line 131 and the like form the gate line group that inputs control signals to the shift register 10. GOA circuitry 125 is formed by the register 10 and the gate line group. At least a part of the GOA circuitry 125 is disposed to overlap with the sealing material 170, when viewed from the normal direction of the first substrate 101.

A plurality of conductive particles 171 are mixed into the sealing material 170. Particles of the plurality of conductive particles 171 are in contact with one another. At least a part of the plurality of conductive particles 171 makes contact with the conductive layer 135. This maintains the plurality of conductive particles 171 at the same potential as the common electrode 155. Although FIG. 5B illustrates the plurality of conductive particles 171 as being sparsely disposed, in actuality the conductive particles 171 are in mutual contact, and all the conductive particles 171 are maintained at the same potential as the common electrode 155.

The plurality of conductive particles 171 are disposed at positions to overlap with at least a part of the GOA circuitry 125, when viewed from the normal direction of the first substrate 101. Specifically, the plurality of conductive particles 171 are disposed so as to overlap with at least a part of the power supply line 133, at least part of the second clock line 132, at least part of the first clock line 131, and at least part of the shift register 10 when viewed from the normal direction of the first substrate 101. By doing this, the plurality of conductive particles 171 function as a shielding member 172 that shields an electric field generated from the GOA circuitry 125.

The second substrate 102 has a transparent main substrate 160 such as glass, quartz, or plastic as a base. A black matrix 161, a color filter 162, and an overcoat layer 163 are laminated on the inside surface side (liquid crystal layer 109 side) of the main substrate 160. The second substrate 102, in contrast to the first substrate 101 on which the pixel electrodes 157 and the common electrode 155 are formed, does not have formed thereon an electrode for fixing the potential. For that reason, there is a tendency to be influenced by potential variations on the first substrate 101 side. However, in the present embodiment, because the shielding member 172 (plurality of conductive particles 171) and the shielding electrode (conductive layer 135) that shield an electric field of the GOA circuitry 125 are formed on the first substrate 101 side, the potential on the second substrate 102 in the vicinity of the display region 100A does not vary greatly, and the influence on the display is small.

Figure 6A:
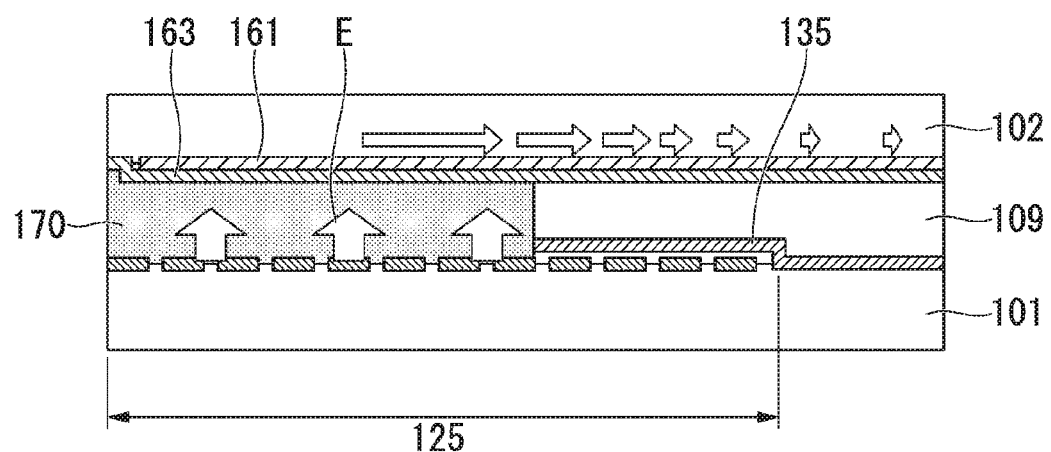
FIG. 6A is a first drawing describing the operating effect of the liquid crystal display device according to the first embodiment.
Figure 6B:
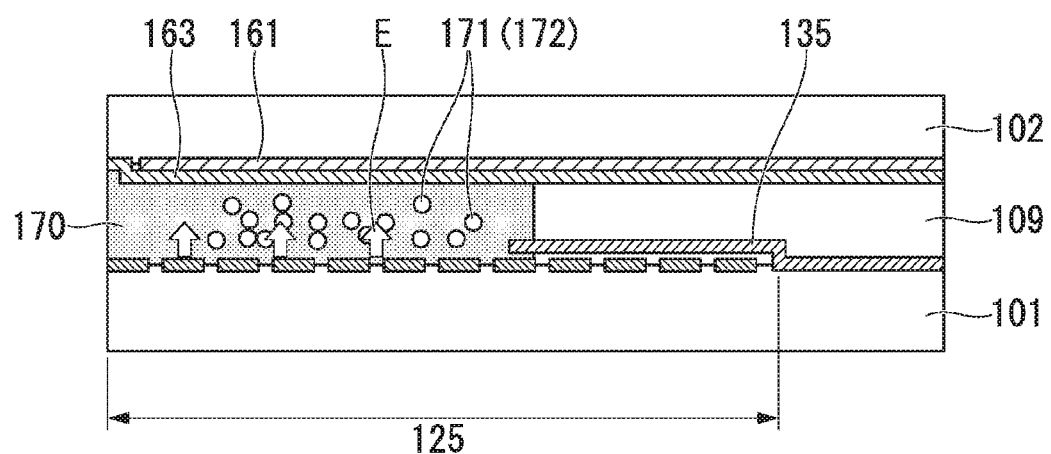
FIG. 6B is a second drawing describing the operating effect of the liquid crystal display device according to the first embodiment.

The operating effect of the liquid crystal display device 1 of the present embodiment will now be described, using FIG. 5A, FIG. 5B, FIG. 6A, and FIG. 6B. FIG. 6A is a drawing showing a constitution in which the conductive particles 171 are not mixed into the sealing material 170. FIG. 6B shows a constitution in which a plurality of conductive particles 171 are mixed into the sealing material 170, and the plurality of conductive particles 171 are made to function as a shielding member 172.

As shown in FIG. 6A, in the constitution in which conductive particles 171 are not mixed into the sealing material 170, an electrical charge accumulates on the second substrate 102 by the electric field E generated from the GOA circuitry 125. The electrical charge spreads to the display region 100A side along the second substrate 102 and causes a potential gradient on the second substrate 102. In the drawing, the right-pointing arrows indicate the flow of the electrical charge, the longer the arrow, the greater being the flow of electrical charge. The electrical charge is accumulated more, the closer is the GOA circuitry 125. The size of the potential variation occurring on the second substrate 102 is greater, the closer is the GOA circuitry 125.

As shown in FIG. 6B, when a plurality of conductive particles 171 are mixed into the sealing material 170, and the plurality of conductive particles 171 are made to function as the shielding member 172, the electric field E generated from the GOA circuitry 125 is shielded by the shielding member 172. An electrical charge that has been generated by a strong electric field E from the GOA circuitry 125 flows in the conductive layer 135 via the conductive particles 171. For that reason, potential variations on the second substrate 102 are suppressed.

If only the electric field shielding effect is considered, it is desirable to cover the entire GOA circuitry 125 with the conductive layer 135 (shield electrode). In this case, however, because a large parasitic capacitance occurs between the conductive layer 135 and the GOA circuitry 125, a delay or voltage drop occurs in the signals controlling the shift register 10 and, as a result, there might be problems such as a decrease in the operating margin of the shift register 10 and an increase in the power consumption. In particular, when the conductive layer 135 is disposed above the power supply line 133, the first clock line 131, and the second clock line 132, the parasitic capacitance greatly distorts the signal, so that sufficient output is not obtained, this being a cause of a poor display. Also, if the voltage of the signal is increased in order to obtain a sufficient output, power consumption increases.

For that reason, in the present embodiment, the conductive layer 135 is not disposed over the power supply line 133, the first clock line 131, and the second clock line 132, but rather over only the shift register 10. In particular, in the present embodiment, the conductive layer 135 is disposed so as to overlap with only a part of the shift register 10, so as to minimize the parasitic capacitance between the shift register 10 and the conductive layer 135 as much as possible. This reduces the influence of signal delay and suppresses the problems of a decrease in the operating margin and increase in the power consumption.

In order to suppress the influence of the electric field generated from the power supply line 133, the first clock line 131, and the second clock line 132, a plurality of conductive particles 171 are mixed into the sealing material 170 in at least the part thereof that overlaps with these lines, and the plurality of conductive particles 171 is made to function as the shielding member 172. Because the shielding member 172 is constituted by a plurality of conductive particles 171, a parallel-plate capacitor is not formed between the power supply line 133, the first clock line 131, and the second clock line 132. For that reason, the parasitic capacitance between the shielding member 172 and the power supply line 133, the first clock line 131, and the second clock line 132 is made small, and power consumption is suppressed.

In the present embodiment, the plurality of conductive particles 171 (shielding member 172) are disposed at a position that overlaps with at least the power supply line 133. For that reason, a high shielding effect is obtained in the region in which the power supply line 133 is formed, which is thought to contribute most to potential variation on the second substrate 102 side.

That is, the shift register 10 has a plurality of registers connected in mutual cascade connection (having bistable circuits 11-1, 11-2, 11-3, 11-4, and so on), and the shift register 10 has connected thereto, a first clock line 131 and a second clock line 132, which supply clock signals, and a power supply line 133 for supplying a power supply voltage. If there are a large number of power supply lines 133, the power supply voltage on the low-potential side in each stage of bistable circuit 11-$k$ (k=1, 2, 3, 4, and so on) is supplied. The low-potential side power supply voltage has a large potential difference (normally 10 V or greater) with the common voltage, which can be thought to be close to the average value of the overall potential on the liquid crystal panel. Therefore, imparting a shielding function to the power supply line 133 has a large merit in preventing light leakage. Because the sealing material 170 is provided at the edge part of the panel, the inclusion of the conductive particles 171 within the sealing material 170 is suitable for shielding the power supply line 133 provided at the edge of the panel.

Next, referring to FIG. 7, the effect of the liquid crystal display device 1 according to the present embodiment will be described.

FIG. 7 describes the results of an experiment to emulate the liquid crystal display device 1 according to the present embodiment.

In this drawing, the vertical axis represents the opposing voltage, and the horizontal axis represents the power supply voltage. The waveform W11 shows the opposing voltage in a display region in the vicinity of the GOA circuitry 125 with respect to the power supply voltage, and the waveform W12 shows the opposing voltage in a display region spaced apart from the GOA circuitry 125 with respect to the power supply voltage. In this case, the opposing voltage indicates the center of the voltage level span applied with changing voltage polarity in AC voltage drive, in which drive is done by applying a voltage that changes voltage polarities (positive voltage and negative voltage). This opposing voltage varies due to the potential variation occurring on the second substrate 102 side by the accumulation of an electrical charge on the second substrate 102.

The graph of FIG. 7 shows, in the constitution shown in FIG. 6A, the results of an experiment to emulate the liquid crystal display device 1 according to the present embodiment, in which the power supply voltage is varied and the opposing voltage is measured. In this case, because the higher is the absolute value of the power supply voltage, the larger is the electric field E generated from the GOA circuitry 125, the power supply voltage along the horizontal axis corresponds to the size of the electric field E generated from the GOA circuitry 125. That is, it corresponds to the case in which the lower is the absolute value of the power supply voltage, the smaller is the electric field E generated from the GOA circuitry 125. In the liquid crystal display device 1 according to the present embodiment, as shown in FIG. 6B, because, by the above described shielding function in the present embodiment, the electric field E generated from the GOA circuitry 125 is suppressed, the graph of FIG. 7 corresponds to the case in which the absolute value of the power supply voltage is shifted downward. Also, because the voltage difference between the waveform W11 and the waveform W12 corresponds to the potential variation occurring on the second substrate 102 side, in the graph of FIG. 7, the lower is the absolute value of the power supply voltage, the smaller is the potential variation occurring on the second substrate 102 side.

That is, according to the results of this emulation experiment, in the liquid crystal display device 1 according to the present embodiment, by the shielding function in the above-described present embodiment, because the graph of FIG. 7 corresponds to when the absolute value of the power supply voltage is shifted downward, the potential variation occurring on the second substrate 102 side can be reduced.

As described above, in the liquid crystal display device 1 of the present embodiment, the first substrate 101 and second substrate 102 are bonded together by the sealing material 170, and pixel electrodes 157, a common electrode 155, shift registers 10, clock lines (for example, the first clock line 131 and the second clock line 132), and the power supply line 133 are formed on the first substrate 101. A plurality of conductive particles 171 are mixed into the sealing material 170, the plurality of conductive particles 171 are maintained at the same potential as the common electrode 155, and the plurality of conductive particles 171 are disposed at a position that overlaps with at least a part of the power supply line 133, when viewed from the normal direction of the first substrate 101.

As a result, the electric field E generated from the power supply line 133 is shielded by the shielding member 172 (plurality of conductive particles 171) and the electrical charge that has been generated by this electric field E flows in the common electrode 155 via the conductive particles 171. For that reason, the liquid crystal display device 1 according to the present embodiment suppresses the occurrence of potential variations on the second substrate 102. Thus, the liquid crystal display device according to the present embodiment can suppress light leakage at the periphery of the display region 100A.

In the present embodiment, the plurality of conductive particles 171 are disposed at a position that overlaps with at least a part of the clock lines (for example, the first clock line 131 and the second clock line 132), when viewed from the normal direction of the first substrate 101.

As a result, the electric field E generated from the clock lines is shielded by the shielding member 172 (plurality of conductive particles 171), and the electric charge generated by the electric field E flows in the common electrode 155 via the conductive particles 171, so that the liquid crystal display device 1 according to present embodiment can further suppress the occurrence of potential variations on the second substrate 102.

In the liquid crystal display device 1 according to the present embodiment, the plurality of conductive particles 171 are mixed into the sealing material 170 at a part that overlaps with at least a part of the power supply line 133, the first clock line 131, and the second clock line 132, thereby making the plurality of conductive particles 171 function as a shielding member 172. Because the shielding member 172 is constituted by a plurality of conductive particles 171, a parallel-plate capacitor is not formed between the power supply line 133, the first clock line 131, and the second clock line 132. For that reason, in the liquid crystal display device 1 according to the present embodiment, the parasitic capacitance between the shielding member 172 and the power supply line 133, the first clock line 131, and the second clock line 132 is made small, enabling suppression of a reduction in the operating margin in the GOA circuitry 125 and of an increase in the power consumption. Thus, the liquid crystal display device 1 according to the present embodiment can suppress leakage of light at the periphery of the display region, while suppressing a reduction in the operating margin and an increase in power consumption in the GOA circuitry 125.

In the present embodiment, the plurality of conductive particles 171 are disposed at a position that overlapping with at least a part of the shift register 10, when viewed from the normal direction of the first substrate 101.

As a result, because the electric field E generated from the shift register 10 is shielded by the shielding member 172 (plurality of conductive particles 171), and the electrical charge due to this electric field E flows in the common electrode 155 via the conductive particles 171, the liquid crystal display device 1 according to the present embodiment can further suppress the occurrence of potential variations on the second substrate 102.

In the present embodiment, the conductive particles 171 are in mutual contact, and also at least one part of the plurality of conductive particles 171 is in contact with the conductive layer 135 that is electrically connected to the common electrode 155, so that a plurality of conductive particles 171 are maintained at the same potential as the common electrode 155.

This enables the liquid crystal display device 1 of the present embodiment to efficiently allow the electrical charge due to the electric field E to escape to the common electrode 155 via the conductive particles 171.

In the present embodiment, the conductive layer 135 is disposed at a position that overlaps with at least a part of the shift register 10, when viewed from the normal direction of the first substrate 101.

This enables the liquid crystal display device 1 of the present invention to shield the electric field E generated from the shift register 10 by the conductive layer 135 and to reduce the electric field E.

In the present embodiment, the common line 114 is formed on the first substrate 101 and the common electrode 155 is electrically connected to the common line 114. A third insulating layer 156 (insulating layer) is formed on the common line 114, and the pixel electrode 157 and conductive layer 135 are formed on the third insulating layer 156. The conductive layer 135 is electrically connected to the common line 114 via a contact hole provided in the third insulating layer 156.

This enables the liquid crystal display device 1 of the present embodiment to electrically connect the conductive layer 135 with the common line 114, using a simple method, via the contact hole.

(Second Embodiment)

A liquid crystal display device 2 according to the second embodiment of the present invention will now be described, with reference made to FIG. 8A and FIG. 8B. FIG. 8A is a partial plan view of the liquid crystal display device 2, showing in enlarged form the constitution in the vicinity of the shift register 10. FIG. 8B is a cross-sectional view of the liquid crystal display device 2 along the line B-B' in FIG. 8A. Constituent elements of the present embodiment that are the same as ones in the first embodiment are assigned the same reference symbols, and the descriptions thereof will be omitted.

Because the shift registers 10 and the bistable circuits 11 in the liquid crystal display device 2 of the second embodiment are the same as those of the first embodiment, they will be omitted herein.

The point of difference of the present embodiment from the first embodiment is the disposition of a conductive layer 181 that connects the shielding member 172 and the common line 114. Although in the first embodiment the conductive layer 135 is formed on the same layer as the pixel electrodes 157, in the present embodiment the conductive layer 181 is formed on the same layer as the common line 114. The conductive layer 181 branches from the common line 114 and is electrically connected to the plurality of conductive particles 171 (shielding member 172) via a contact hole provided in the third insulating layer 156.

The conductive layer 181 may be disposed at a position that overlaps with the shift register 10 or one that does not overlap with the shift register 10, when viewed from the normal direction of the first substrate 101. If the conductive layer 181 is disposed in a position that does not overlap with the shift register 10, although the conductive layer 181 does not function as a shielding electrode that shields the electric field generated from the shift register 10, because the conductive layer 181 and the shift register 10 do not overlap, the occurrence of parasitic capacitance between the conductive layer 181 and the shift register 10 is suppressed.

As described above, in the liquid crystal display device 2 according to the present embodiment (second embodiment), the common line 114 and the conductive layer 181 are formed on the first substrate 101, and the common electrode 155 and the common line 114 are electrically connected. The third insulating layer 156 (insulating layer) is formed on the common line 114 and the conductive layer 181. The conductive layer 181 is electrically connected to the plurality of conductive particles 171 (shielding member 172) via a contact hole provided in the third insulating layer 156.

This enables the liquid crystal display device 2 of the present embodiment to electrically connect the plurality of conductive particles 171 (shielding member 172) with the common line 114 via the conductive layer 181, using a simple method, via the contact hole. Thus, the liquid crystal display device 2 of the present embodiment, similar to the first embodiment, can suppress leakage of light at the periphery of the display region 100A.

The present invention is not restricted to the above-noted embodiments, but rather can be subjected to modifications, within the spirit of the present invention.

For example, although in the example shown in FIG. 1 shift registers 10 are shown as an example of disposition on both sides of the display 100, the constitution may be one in which a shift register 10 is disposed on one side of the display 100. Also, when shift registers 10 are disposed on both sides of the display 100, the constitution may be such that the right-side shift register 10 drives odd-numbered stage gate bus lines and the left-side shift register 10 drives even-numbered stage gate bus lines.

Also, although in the example shown in FIG. 1 a bus line for the low-potential DC voltage VSS is disposed as the power supply line, a constitution may be adopted in which a high-potential DC voltage VDD (for example, a high level voltage of the gate signal) is disposed.

INDUSTRIAL APPLICABILITY

An aspect of the present invention can be applied to liquid crystal display devices and the like that are required to suppress light leakage at the periphery of a display region.

DESCRIPTION OF THE REFERENCE SYMBOLS 1, 2 Liquid crystal display device
101 First substrate
102 Second substrate
114 Common line
10 Shift register
131 First clock line (clock line)
132 Second clock line (clock line)
133 Power supply line
135 Conductive layer
155 Common electrode
156 Third insulating layer (insulating layer)
157 Pixel electrode
170 Sealing material
171 Conductive particle
180 First substrate
181 Conductive layer

The invention claimed is:

1. A liquid crystal display device comprising:
a first substrate;
a second substrate;
a sealing material which bonds the first substrate and the second substrate toclether;
a pixel electrode, a common electrode, a shift register, a clock line, and a power supply line formed on the first substrate; and
a plurality of conductive particles mixed into the sealing material,
wherein the plurality of conductive particles are maintained at a same potential as the common electrode, and the plurality of conductive particles are disposed at a position overlapping at least a part of the power supply line, when viewed from a normal direction of the first substrate.

2. The liquid crystal display device according to claim 1, wherein the plurality of conductive particles are disposed at a position overlapping at least a part of the clock line, when viewed from the normal direction of the first substrate.

3. The liquid crystal display device according to claim 2, wherein the plurality of conductive particles are disposed at a position overlapping at least a part of the shift register, when viewed from the normal direction of the first substrate.

4. The liquid crystal display device according to claim 1, wherein the plurality of conductive particles are in mutual contact and also, by at least a part of the plurality of conductive particles contacting with a conductive layer electrically connected to the common electrode, the plurality of conductive particles are maintained at a same potential as the common electrode.

5. The liquid crystal display device according to claim 4, wherein the conductive layer is disposed at a position overlapping at least a part of the shift register, when viewed from the normal direction of the first substrate.

6. The liquid crystal display device according to claim 4, wherein a common line is formed on the first substrate,
the common electrode is electrically connected to the common line,
an insulating layer is formed on the common line,
the pixel electrode and the conductive layer are formed on the insulating layer, and
the conductive layer is electrically connected to the common line via a contact hole provided in the insulating layer.

* * * * *